United States Patent
Le et al.

(10) Patent No.: US 12,453,060 B2
(45) Date of Patent: Oct. 21, 2025

(54) TWO PHASE IMMERSION COOLING SYSTEM WITH USEABLE WARMED LIQUID OUTPUT

(71) Applicant: Intel Corporation, Santa Clara, CA (US)

(72) Inventors: Linh M. Le, Portland, OR (US); Ra'anan Sover, Tirat Carmel (IL); Alexey Chinkov, Haifa (IL); James D. Williams, Portland, OR (US); Paul C. George, Beaverton, OR (US); Paul J. Gwin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 702 days.

(21) Appl. No.: 17/556,763

(22) Filed: Dec. 20, 2021

(65) Prior Publication Data
US 2022/0256744 A1   Aug. 11, 2022

Related U.S. Application Data

(60) Provisional application No. 63/148,405, filed on Feb. 11, 2021.

(51) Int. Cl.
*H05K 7/20*   (2006.01)

(52) U.S. Cl.
CPC ......... *H05K 7/20836* (2013.01); *H05K 7/203* (2013.01); *H05K 7/20318* (2013.01); *H05K 7/20327* (2013.01); *H05K 7/20818* (2013.01)

(58) Field of Classification Search
CPC ............... H05K 7/20836; H05K 7/203; H05K 7/20318; H05K 7/20327; H05K 7/20818
See application file for complete search history.

(56) References Cited

U.S. PATENT DOCUMENTS

| | | | |
|---|---|---|---|
| 2014/0218861 A1* | 8/2014 | Shelnutt | H05K 7/20818 361/679.53 |
| 2020/0403283 A1* | 12/2020 | Gao | H05K 7/20309 |
| 2022/0174847 A1* | 6/2022 | Heydari | G06F 1/206 |

* cited by examiner

*Primary Examiner* — Charles R Kasenge
(74) *Attorney, Agent, or Firm* — Hanley, Flight & Zimmerman, LLC

(57) ABSTRACT

An apparatus is described. The apparatus includes a controller to cause a volume of an ambient of a two phase immersion cooling system to be modulated. The ambient is to include a condenser that is to emit fluid warmed by vapor in the ambient. The vapor is to be generated by heat. The heat is to be generated by electronic devices that are to be immersed in a liquid bath. The controller is to cause the volume to increase in response to a first temperature of the fluid approaching a first lower limit. The controller is to cause the volume to decrease in response to a second temperature of the fluid approaching a second higher limit.

19 Claims, 14 Drawing Sheets

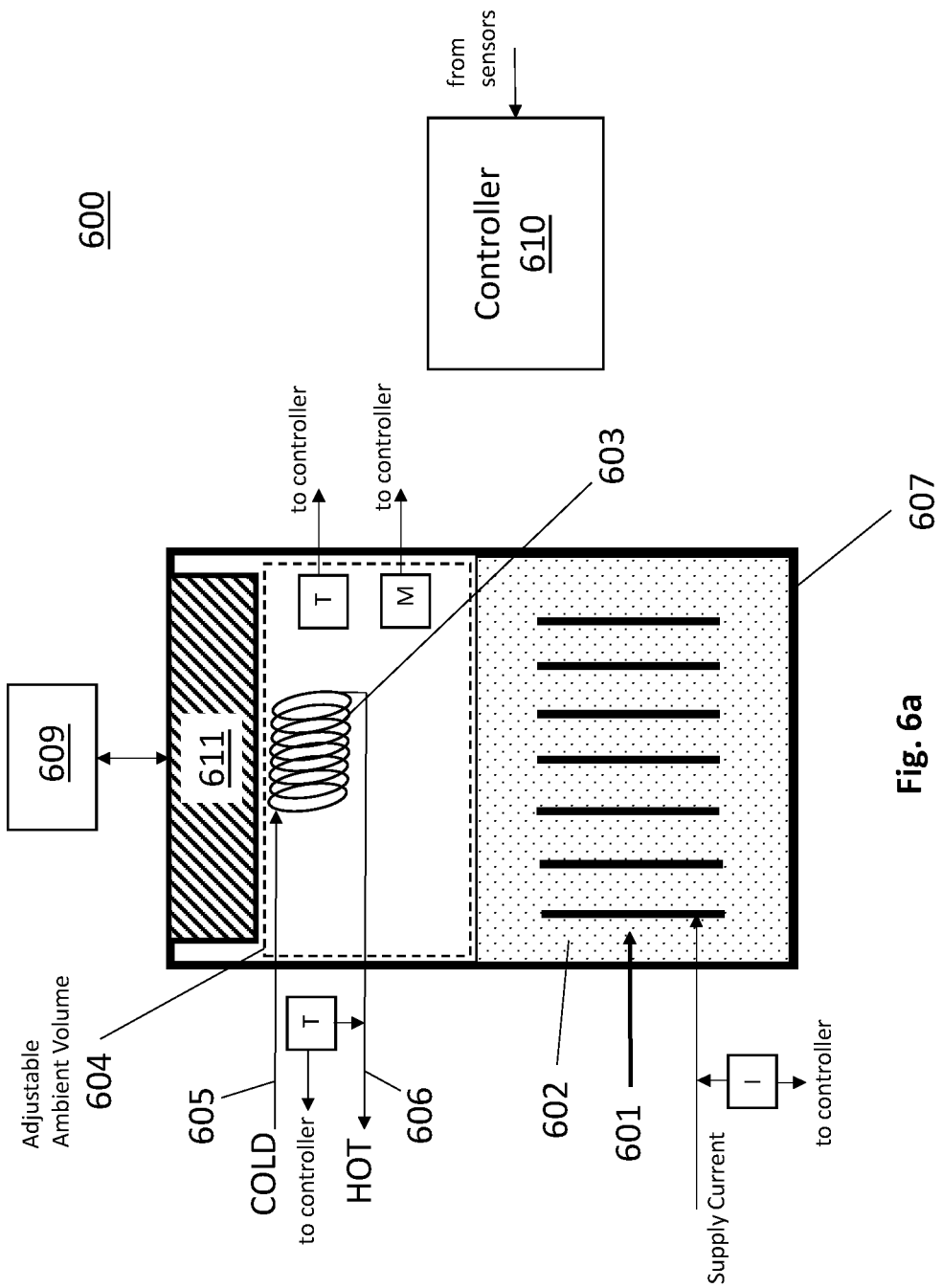

TWO PHASE IMMERSION COOLING SYSTEM WITH USEABLE WARMED LIQUID OUTPUT

RELATED APPLICATION

This application claims the benefit of U.S. Provisional Application No. 63/148,405, entitled, "ADAPTIVE COOLANT BOILING POINT THROUGH PHYSICAL ENVIRONMENTAL CHANGES FOR IMMERSIVE COOLING SOLUTIONS", filed Feb. 11, 2021, which is incorporated by reference in its entirety.

BACKGROUND

System design engineers face challenges, especially with respect to high performance data center computing, as both computers and networks continue to pack higher and higher levels of performance into smaller and smaller packages. Creative packaging and cooling solutions are therefore being designed to keep pace with such aggressively designed systems.

FIGURES

A better understanding of the present invention can be obtained from the following detailed description in conjunction with the following drawings, in which:

FIGS. 6a and 6b show a fourth embodiment of an improved two phase immersion cooling system;

DETAILED DESCRIPTION

Figure 1:
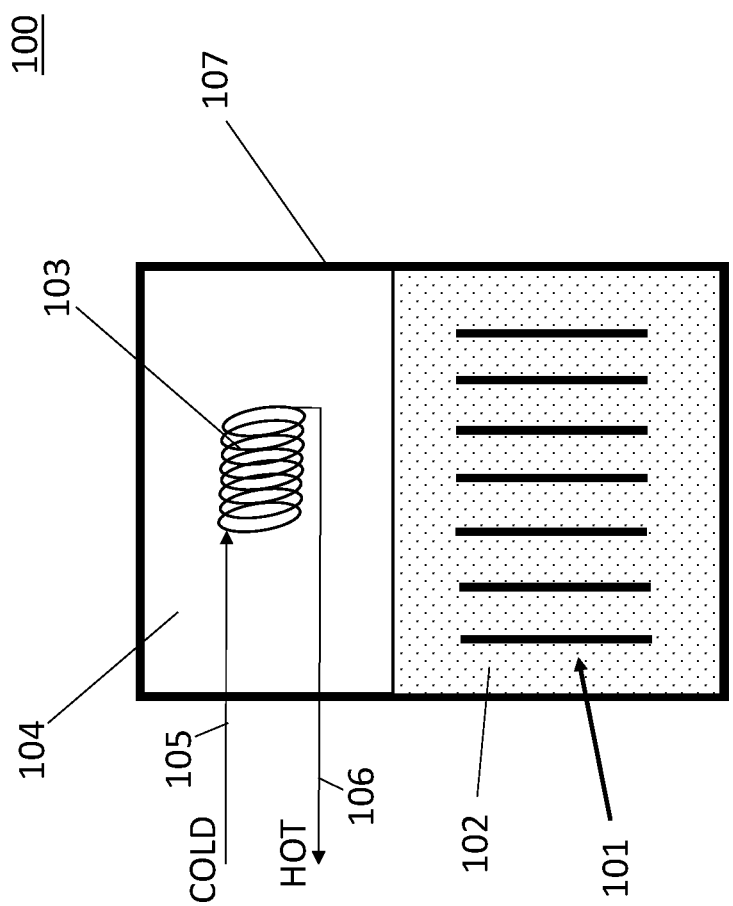
FIG. 1 shows a two phase immersion cooling system.

FIG. 1 depicts one or more electronic circuit boards 101 (PC boards) with mounted electrical components (e.g., semiconductor chips) that are powered on and operating while the boards 101 and their components are immersed in a bath of thermally conducting but electrically insulating liquid 102 within a chamber 107. The complete immersion of the boards 101 and their components maximizes the surface area over which heat from the operating semiconductor chips can be released into the cooling medium (coolant 102). Additionally, as compared to air cooled systems, a liquid generally has a much higher latent heat and specific heat than air, resulting in a much lower thermal resistance for electronics cooling.

Here, heat from the semiconductor chips that are operating on electronic boards 101 is transferred from the chips/boards to the immersion bath 102. During initial heat up, the temperature of the bath coolant 102 warms in response to the heat from the chips/boards 101 but does not boil (the temperature of the bath coolant 102 remains below the liquid's boiling point). As the chips continue to operate, the temperature of the bulk fluid in the bath 102 reaches its boiling temperature. Vapor from the bath is condensed by a condenser 103. Here, the condenser 103 typically includes a coil or other arrangement of thermally conductive piping (e.g., metal or metal alloy pipes) through which cold water 105 is injected.

The vapor from the bath 102 condenses on the cooled condenser pipes 103, which, in turn, warms the fluid within the pipes 103 causing warmed fluid 106 to exit the chamber 107, and, condenses the vapor back to a liquid which subsequently falls back into the bath 102. The removal of warmed fluid 106 from the chamber 107 combined with the return of condensed vapor back to the bath 102 effectively removes heat generated by the chips/boards 101 from the overall system 100.

Government and/other large entities are seeking ways to conserve and/or reduce energy consumption. As such, industrial engineers and/or other facilities focused professionals are seeking ways to reuse the heat that is dissipated by the electronic devices in a data center. A data center's electronic devices consume large amounts of electrical energy. A significant percentage of the electrical energy is then dissipated as heat, which, as described above is removed as warmed fluid 106 from the data center's immersion cooling system(s) 100.

Notably, the warmed liquid 106 could be reused, e.g., in heating equipment, or any other application that can make use of a heat source or partial heat source. For example, if a data center that employs immersion cooling is operating near commercial and/or residential buildings in a colder climate, the warmed fluid could be pumped through the heaters of such buildings to warm them. As another example, if the data center (e.g., a micro data center) is near a cell tower/shelf with base stations and/or other equipment that reside outdoors in a cold climate (e.g., to effect a content delivery network and/or edge computing function/service), the warmed fluid 106 generated by the immersion cooling system 100 could be pumped through such equipment to keep their temperatures above their rated minimum.

A challenge, however, concerns variation of the warmed fluid's 106 temperature. Specifically, the temperature of the warmed fluid 106 can vary with the electrical power consumption and corresponding heat dissipation of the devices on the electronic circuit boards 101. Specifically, as electrical power consumption increases, the rate of vaporization increases as the cooling system transitions to a new steady state, resulting in warmer output fluid 106. By contrast, as electrical power consumption decreases, the rate of vaporization decreases as the cooling system transitions to a new steady state, resulting in cooler output fluid 106. Because the workloads offered to electronic systems within a data center can vary greatly, the temperature of the warmed fluid 106 can vary greatly.

This presents problems with respect to the aforementioned uses of the warmed fluid 106. Specifically, for example, the greater the variation of the warmed fluid's temperature, the more difficult it becomes to heat buildings and/or equipment with precision.

Figure 2:
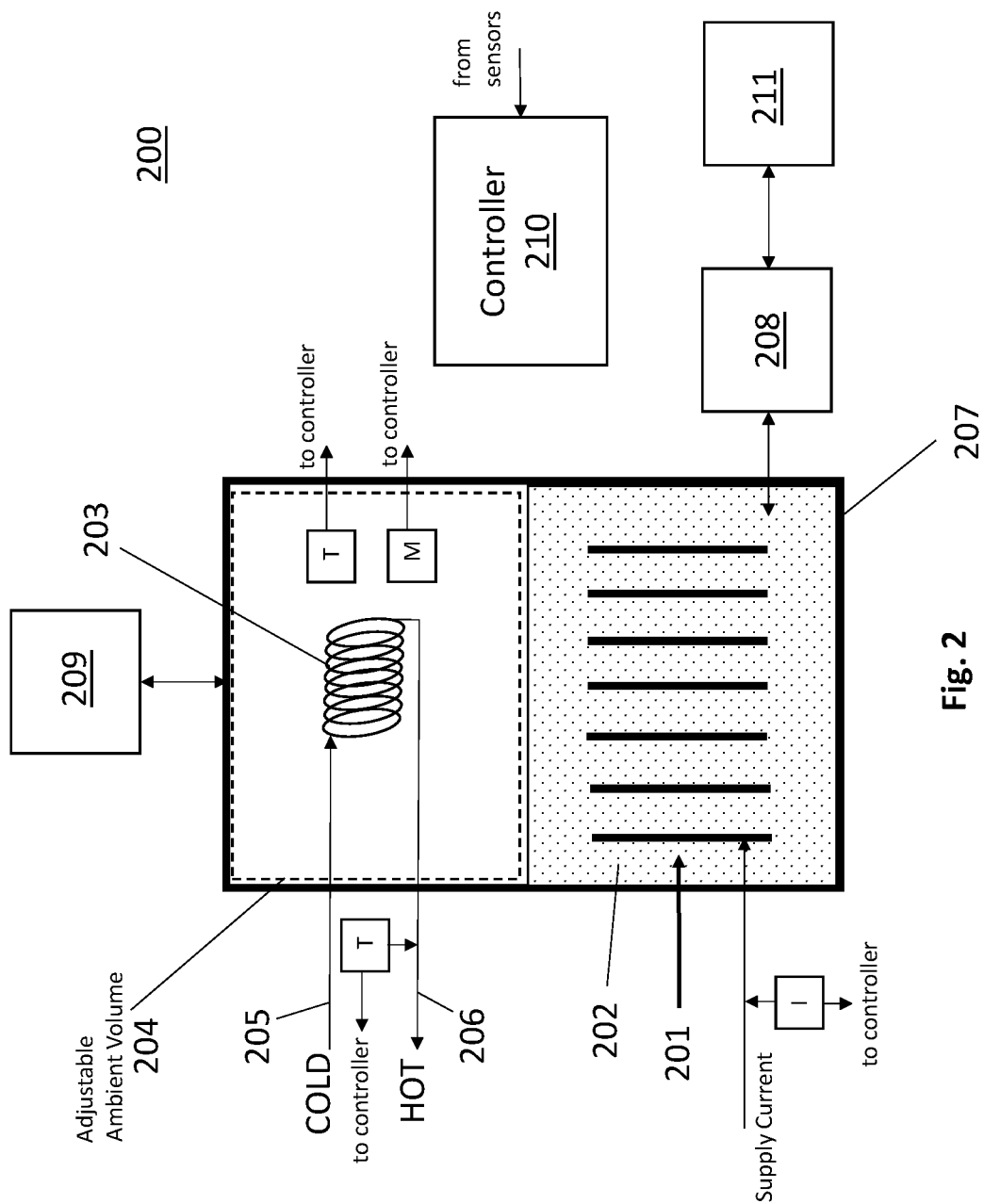
FIG. 2 shows an improved two phase immersion cooling system.

FIG. 2 therefore shows an improved immersion cooling system 200 that modulates the boiling activity within the immersion bath 202, commensurate with a transition of the cooling system from a first steady state to a second steady state, to keep the temperature of the warmed fluid 206 within some specified or otherwise acceptable range.

Here, if too much boiling activity is present in the immersion bath 202 (e.g., as a consequence of the workload of the electronics having been suddenly increased which causes the cooling system to depart from its previous steady state and transition to a new steady state), the temperature of the warmed fluid 206 could rise above some maximum limit (too much heat is vaporizing from the bath 202 into the ambient 204). As such, in response, the system 200 of FIG. 2 rapidly increases the boiling point within the immersion bath 202 to keep the temperature of the warmed fluid 206 below some maximum limit.

By contrast, if too little boiling activity is present in the immersion bath 202 (e.g., as a consequence of the workload of the electronics having been suddenly decreased which causes the cooling system to depart from its previous steady state and transition to a new steady state), the temperature of the warmed fluid 206 could fall below some minimum limit (not enough heat is vaporizing from the bath 202 into the ambient 204). As such, in response, the system 200 of FIG. 2 rapidly decreases the boiling point within the immersion bath 202 to keep the temperature of the warmed fluid above some minimum limit. The boiling point changes can be made rapidly to keep up with similar rapid changes in the workload of the electronics.

By keeping the temperature of the warmed fluid 206 within the maximum and minimum limits by way of the aforementioned modulation of boiling point within the immersion bath 202, downstream equipment that reuses the warmed fluid (e.g., heating equipment) can depend upon a warmed fluid stream having a relatively steady temperature.

In various embodiments, the boiling point is modulated, commensurate with a transition between different cooling system steady states, by modulating the volume of the ambient 204 within the chamber. In various embodiments, the volume of the ambient 204 is modulated by either or both of: 1) changing the volume of the immersion bath liquid 202 in the chamber 207; 2) mechanically changing the physical dimensions within the chamber 207 above the surface of the immersion bath 202 to physically change the volume of space of the ambient 204. More details on these techniques is provided further below with respect to FIGS. 3a,b, 4a,b, 5a,b and 6a,b.

Regardless of how the volume of the ambient 204 is modulated/changed commensurate with a transition between different cooling system steady states, for a constant amount of heat being dissipated by the electronic boards 201 into the immersion bath 202, reducing the volume of the ambient 204 increases the vapor pressure in the ambient 204, which in turn, increases the boiling point of the immersion bath liquid 202. Increasing the boiling point of the immersion bath liquid 202 reduces the boiling rate in the immersion bath 202 which decreases heat transfer into the ambient 204 (vaporization is reduced). In this case, the percentage of heat dissipated by the electronic boards 201 that is cooled by convection cooling within the immersion bath 202 increases and the percentage of the dissipated heat that is cooled by vaporization decreases.

By contrast, again for a constant amount of heat being dissipated by the electronic boards 201 into the immersion bath 204, increasing the volume of the ambient 204 decreases the vapor pressure in the ambient 204, which in turn, decreases the boiling point of the immersion bath liquid 202. Decreasing the boiling point of the immersion bath liquid 202 increases the boiling rate in the immersion bath 202 which increases heat transfer into the ambient 204 (vaporization is increased). In this case, the percentage of heat dissipated by the electronic boards 201 that is cooled by convection cooling within the immersion bath 202 decreases and the percentage of the dissipated heat that is cooled by vaporization increases.

Thus, in various embodiments, if the heat dissipated by the electronic circuit boards 201 into the immersion bath 202 increases (e.g., owing to increased workload) resulting in increased vaporization and a rising warmed fluid 206 temperature that encroaches a maximum limit, as part of the system's transition to a new steady state, the system 200 of FIG. 2 decreases the volume of ambient 204 to increase the boiling point of the immersion bath liquid 202, which reduces vaporization and lowers the temperature of the warmed fluid 206.

By contrast, if the heat dissipated by the electronic circuit boards 201 into the immersion bath 202 decreases (e.g., owing to decreased workload) resulting in decreased vaporization and a falling warmed fluid 206 temperature that encroaches a minimum limit, as part of the system's transition to a new steady state, the improved system 200 of FIG. 2 increases the volume of ambient 204 to decrease the boiling point of the immersion bath liquid 202, which increases vaporization and raises the temperature of the warmed fluid 206.

The above described modulation processes keep the amount of heat that is vaporized into the ambient 204 approximately constant (within some modest/acceptable range) during transition between the system's steady states. Because the amount of heat that is vaporized into the ambient 204 is approximately constant, the temperature of the warmed fluid 206 is kept approximately constant.

Because the amount of heat that is vaporized into the ambient 204 remains approximately constant irrespective of the amount of heat that the electronic circuit boards 201 dissipate into the immersion bath 202, changes in the amount of heat dissipated by the electronic circuit boards 201 are adapted to by changing the amount of convection cooling that occurs within the immersion bath 202 (convection cooling is cooling due to motion of the bath's molecules within the immersion bath).

Specifically, as the heat dissipated by the electronic boards 201 increases, the volume of the ambient 204 is decreased (as per the modulation technique) and the reliance on convection cooling within the immersion bath 202 increases. Likewise, as the heat dissipated by the electronic system boards 201 decreases, the volume of the ambient 204 is increased (as per the modulation technique) and the reliance on convection cooling within the immersion bath 202 decreases.

FIG. 2 depicts the presence of a controller 210 which monitors any of a number of cooling system parameters to detect if a condition has arisen that warrants changing the volume of the ambient 204. Specifically, in various embodiments, one or more of the following is monitored by the controller 209: 1) the temperature of the warmed fluid 206; 2) the amount of vapor in the ambient 204; 3) the temperature in the ambient 204; 4) the workload and/or power consumption of the electronic circuit boards 201. As such, the controller 210 can be coupled to one or more of the following sensors (not shown): 1) thermocouples "T" (for 1) and 3) above); 2) a vapor pressure detector "M" (for 2) above); 3) an ammeter or other circuit that detects the supply current draw "I" of the electronic circuit boards 201. The controller 210 can also receive a signal from control software of the data center and/or its systems that describes the workload being presented to the electronic circuit boards 201.

FIG. 2 also shows a pump 208 and a servo motor 209 that are coupled to the chamber 207 to effect changes to the volume of the ambient 205 as described immediately below.

Figure 3A:
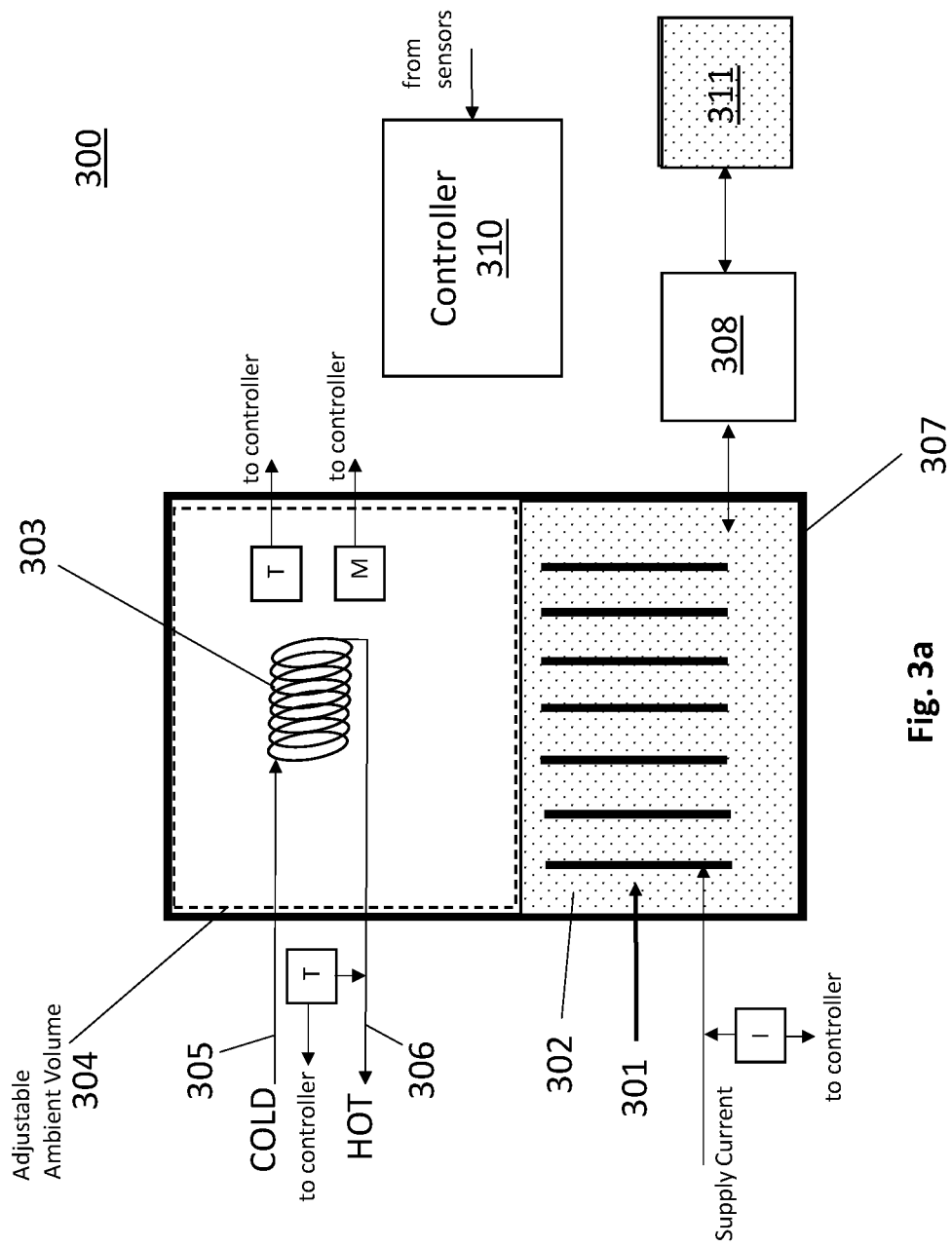
FIGS. 3a, 3b and 3c show a first embodiment of an improved two phase immersion cooling system.
Figure 3B:
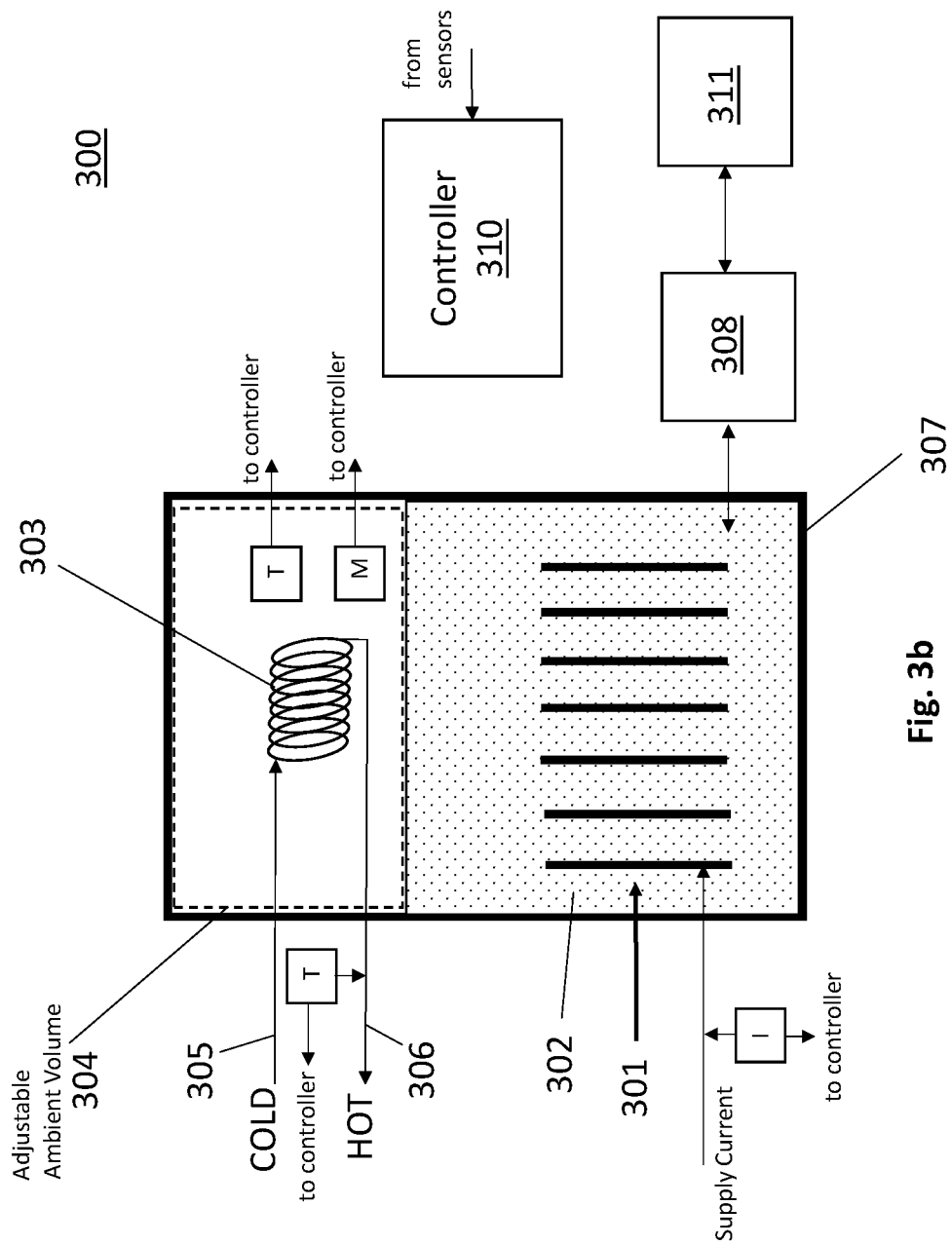

FIGS. 3a and 3b are directed to an embodiment of a system 300 that modulates the volume of the ambient 304 by increasing or decreasing the amount of immersion bath liquid 302 within the chamber 307. Here, as can be seen in FIG. 3*a*, the controller 310 is coupled to a pump 308 that has a reservoir 311 of immersion bath liquid.

FIG. 3*a* shows a first extreme transition in which the reservoir 311 has just become full of liquid and the volume of immersion bath liquid 302 within the chamber 307 has just become a minimum. This corresponds to maximum ambient volume 304 (which in turn corresponds to minimum boiling point and maximum vaporization). By contrast, FIG. 3*b* shows a second extreme transition in which the contents of the reservoir 311 have just been fully pumped into the chamber 307 by the pump 308 which maximizes the amount of immersion bath liquid 302 within the chamber 307. This corresponds to minimum ambient volume 304 (which in turn corresponds to maximum boiling point and minimum vaporization).

In operation, if monitored conditions indicate the temperature of the output fluid 306 is encroaching a low limit, the controller 310 activates the pump 308 to draw liquid into the reservoir 311 from the chamber 307, which in turn increases vaporization and causes the temperature of the output fluid 306 to rise during the transition phase. By contrast, if monitored conditions indicate the temperature of the output fluid 306 is encroaching a high limit, the controller 310 activates the pump 308 to pump liquid into the chamber 307 from the reservoir 311, which in turn decreases vaporization and causes the temperature of the output fluid 306 to fall during the transition phase.

Figure 3C:
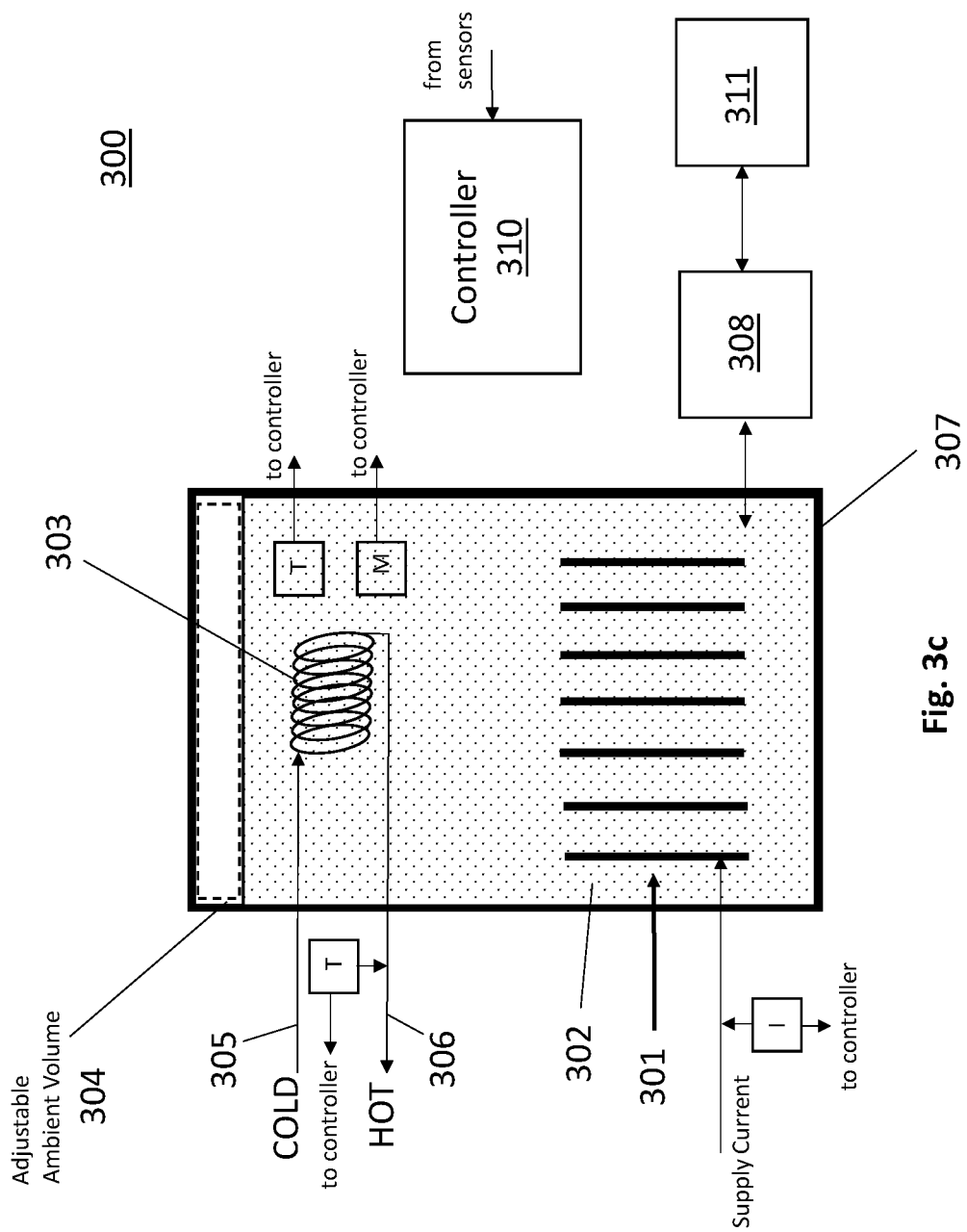

FIG. 3*c* shows an extended possible mode of operation of the system of FIGS. 3*a* and 3*b* in which the immersion bath liquid 301 is raised to a level (and the ambient region 304 is shrunk) to the point where the condenser 303 lays within the immersion bath 302 to allow heat transfer directly from the bath 302 to the condenser 303. This state can be used, e.g., to more rapidly warm the immersion bath fluid 302 during a transition state change from FIG. 3*a* to FIG. 3*b*, or, as an extended state that is reached after the state of FIG. 3*b* in cases where the power increase of the electronics is extreme and the new higher boiling point cannot prevent vapor from reaching the condenser. The state of FIG. 3*c* allows heat to transfer to the condenser 303 while the temperature of the liquid 301 is warming to the boiling point.

Figure 4A:
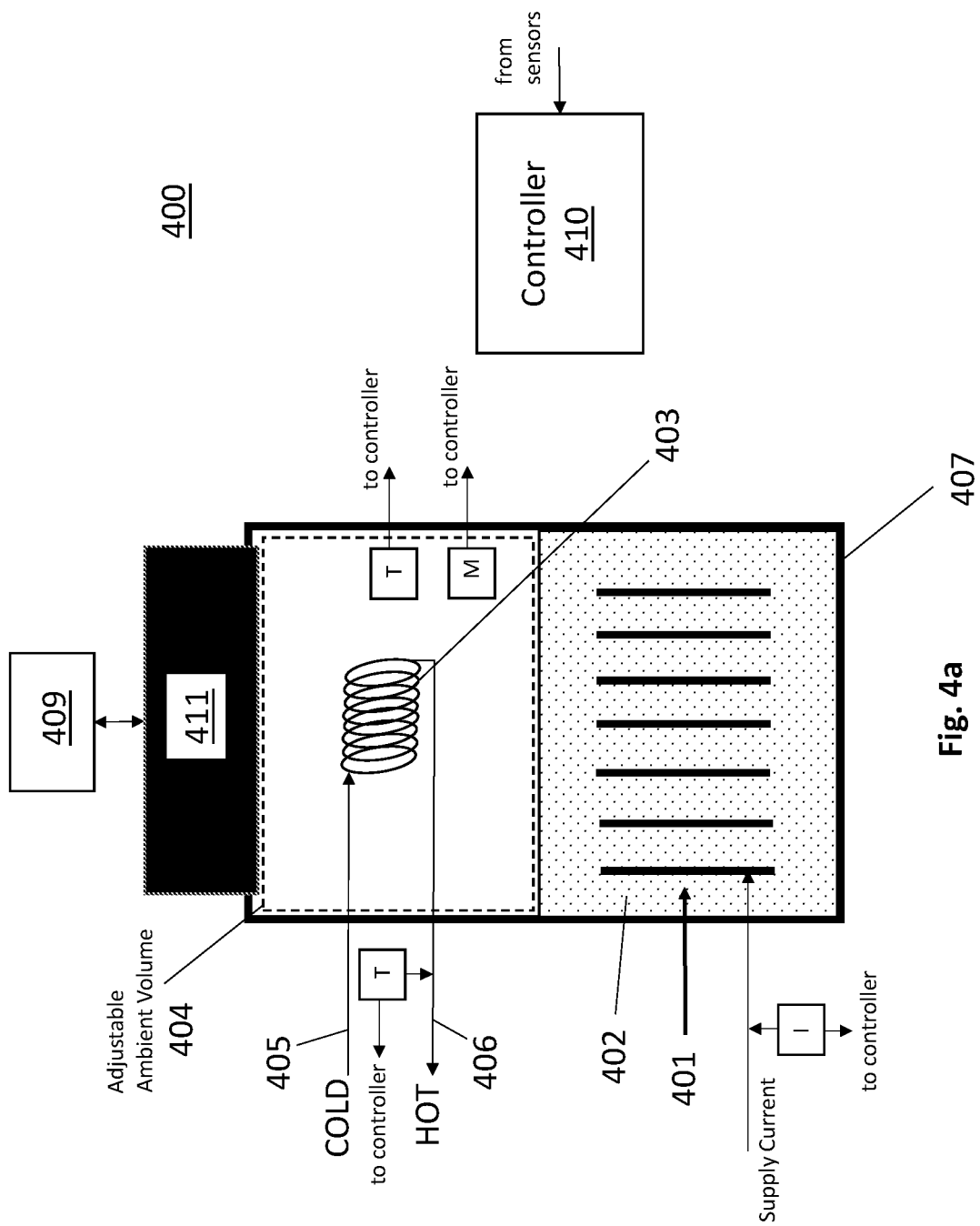
FIGS. 4a and 4b show a second embodiment of an improved two phase immersion cooling system.
Figure 4B:
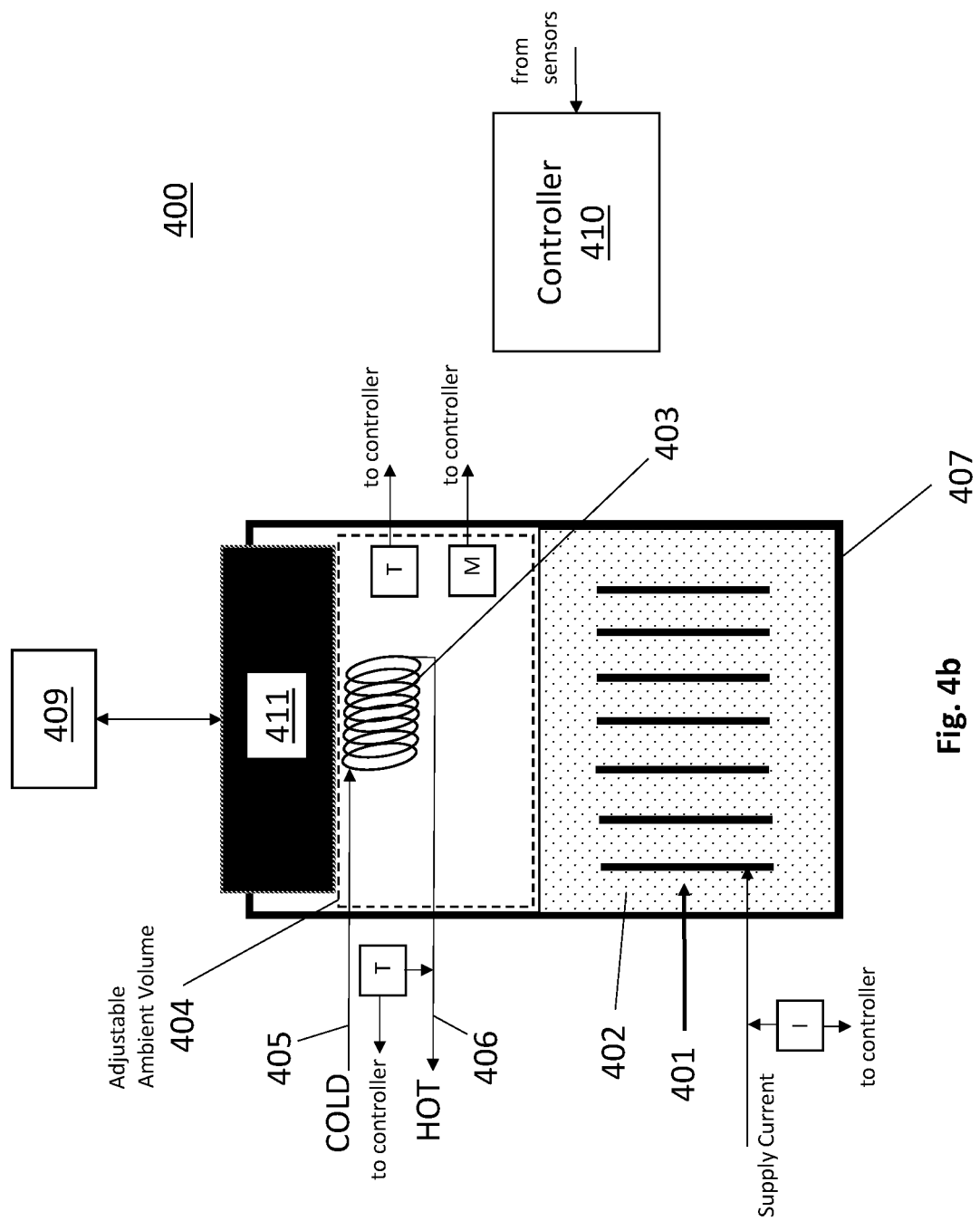

FIGS. 4*a* and 4*b* are directed to an embodiment of a system that modulates the volume of the ambient 404 by raising or lowering a displacement element (e.g., piston, bellows, etc.) 411 that extends into the ambient 404. Here, as can be seen in FIG. 4*a*, the controller 410 is coupled to a servo motor 409 that is mechanically coupled to the displacement element 411.

FIG. 4*a* shows a first extreme transition in which the servo motor 409 has just fully raised the displacement element 411 so that its lower surface is approximately level with the roof of the chamber 407. This corresponds to maximum ambient volume 404 (which in turn corresponds to minimum boiling point and maximum vaporization). By contrast, FIG. 4*b* shows a second extreme transition in which the servo motor 409 has just fully lowered the displacement element 411 which corresponds to minimum ambient volume 404 (which in turn corresponds to maximum boiling point and minimum vaporization).

In operation, if monitored conditions indicate the temperature of the output fluid 406 is encroaching a low limit, the controller 410 activates the server motor 409 to raise the piston 411, which in turn increases vaporization and causes the temperature of the output fluid 406 to rise. By contrast, if monitored conditions indicate the temperature of the output fluid 406 is encroaching a high limit, the controller 410 activates the servo motor 409 to push the piston 411 further into the chamber 407, which in turn decreases vaporization and causes the temperature of the output fluid 406 to fall.

Figure 5A:
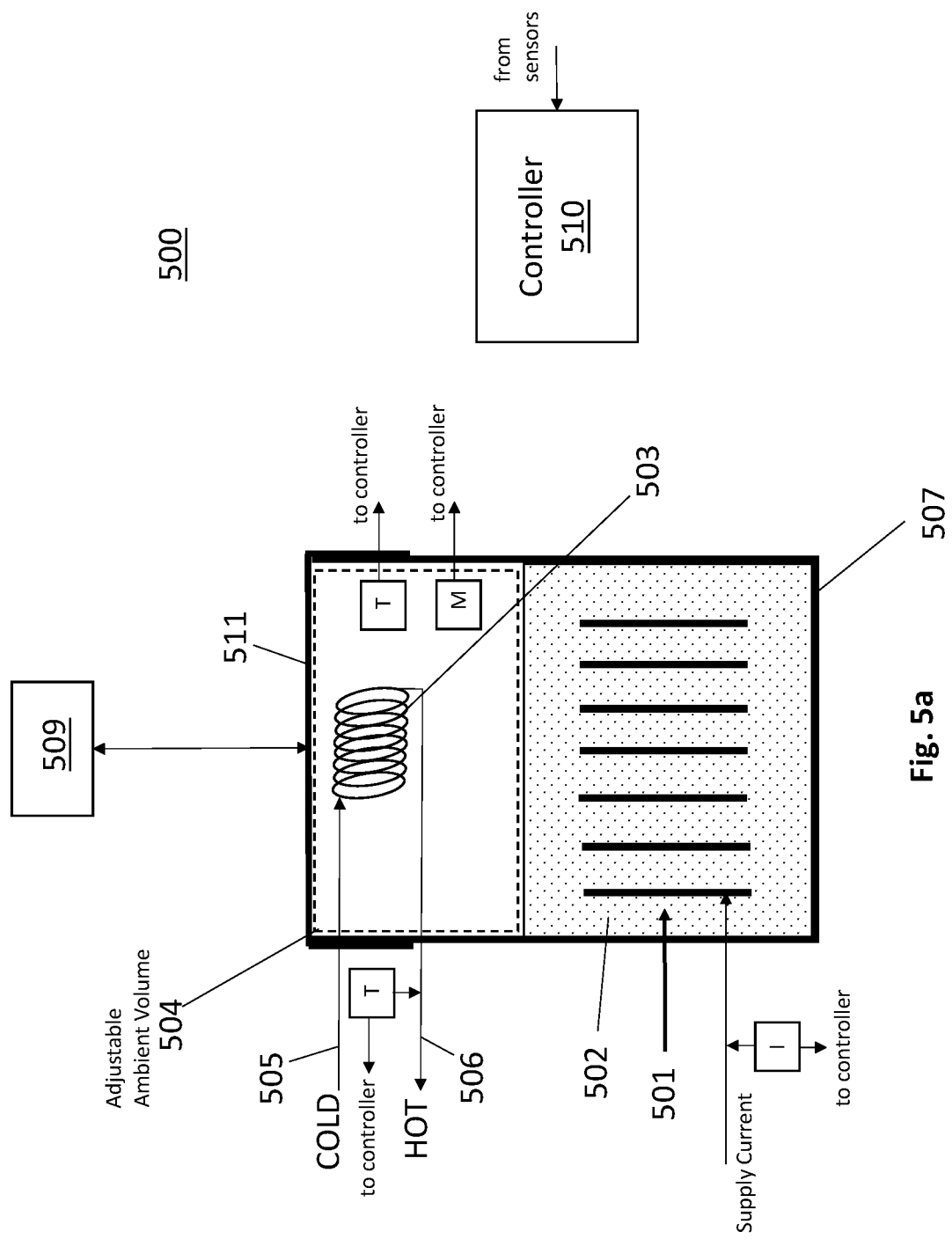
FIGS. 5a and 5b show a third embodiment of an improved two phase immersion cooling system.
Figure 5B:
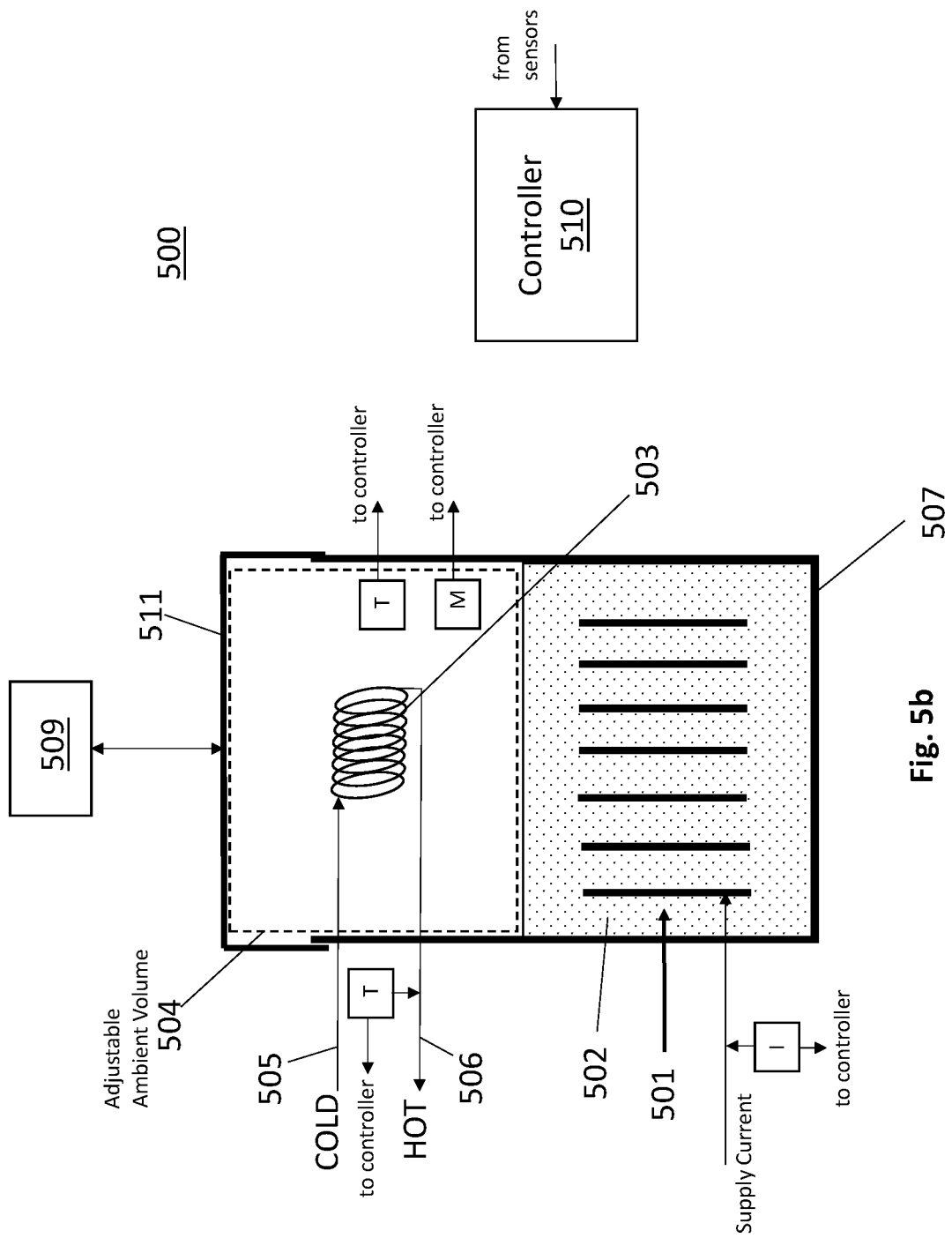

FIGS. 5*a* and 5*b* are directed to an embodiment of a system that modulates the volume of the ambient 504 by raising or lowering the ceiling 511 of the chamber 507. Here, as can be seen in FIG. 5*a*, the controller 510 is coupled to a servo motor 509 that is mechanically coupled to a ceiling piece 511 of the chamber 507. In the embodiment of FIG. 5*a*, the ceiling piece 511 has slightly larger cross sectional area (e.g., radius) than a lower base piece of the chamber 507 and fits around the lower base piece 507.

FIG. 5*a* shows a first extreme transition in which the servo motor 509 has just fully raised the ceiling piece 511 to a maximum height. This corresponds to maximum ambient volume 504 (which in turn corresponds to minimum boiling point and maximum vaporization). By contrast, FIG. 5*b* shows a second extreme transient in which the servo motor 509 has just fully lowered the ceiling piece 511 to a minimum height. This corresponds to minimum ambient volume 504 (which in turn corresponds to maximum boiling point and minimum vaporization).

In operation, if monitored conditions indicate the temperature of the output fluid 506 is encroaching a low limit, the controller 510 activates the server motor 509 to raise the ceiling 511, which in turn increases vaporization and causes the temperature of the output fluid 506 to rise. By contrast, if monitored conditions indicate the temperature of the output fluid 506 is encroaching a high limit, the controller 510 activates the servo motor 509 to lower the ceiling 511, which in turn decreases vaporization and causes the temperature of the output fluid 506 to fall.

Figure 6B:
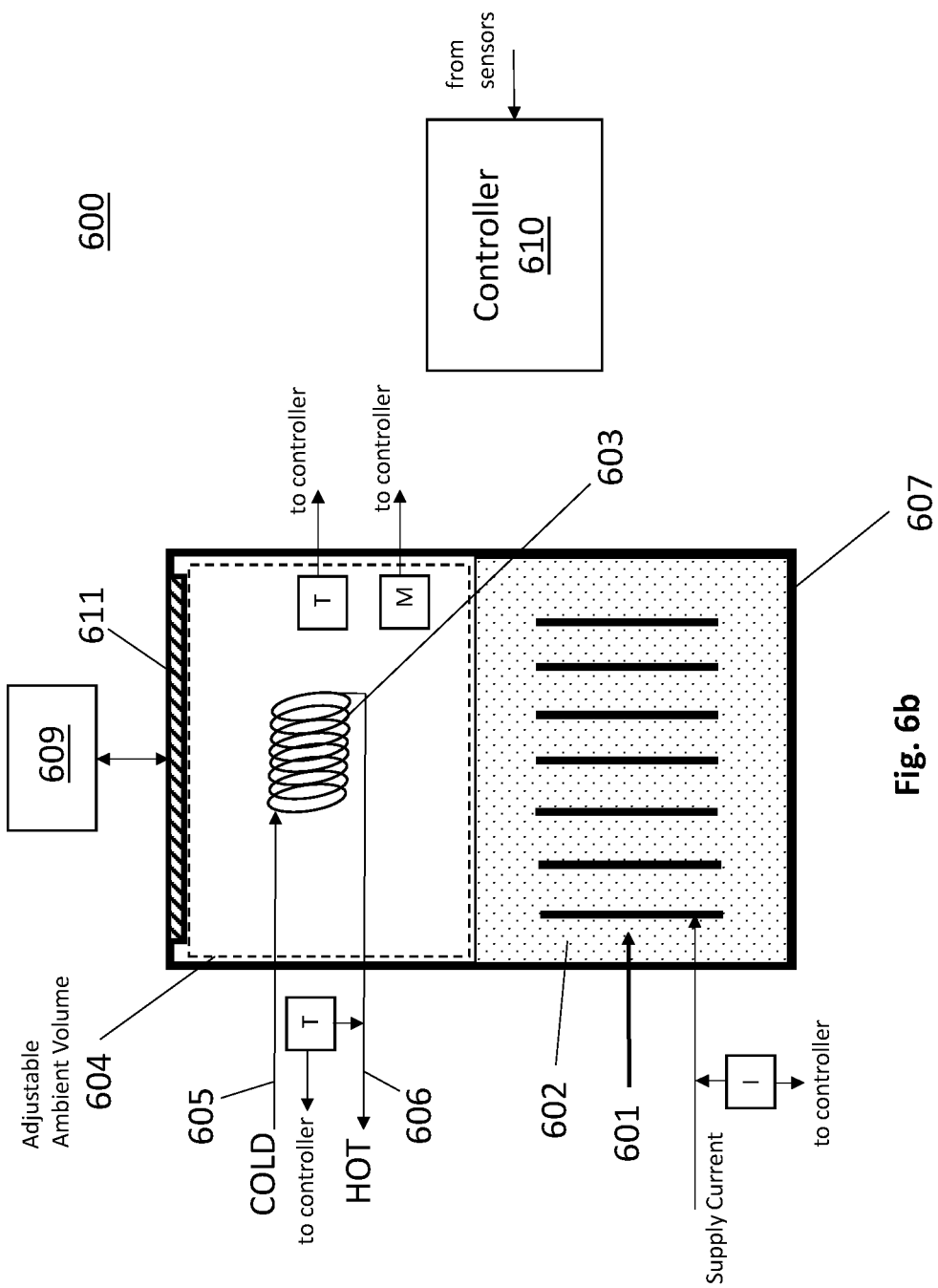

FIGS. 6*a* and 6*b* are directed to an embodiment of a system 600 that modulates the volume of the ambient 604 by expanding or compressing a structure 611 (e.g., a balloon) within the ambient region 604 of the chamber 607. Here, as can be seen in FIG. 6*a*, the controller 610 is coupled to an motor 609 (e.g., pump, servo motor, etc.) that is mechanically coupled to an expandable/compressible structure 611 that is mounted inside the ambient region 604.

In one approach the expandable/compressible structure 611 is a balloon and the motor 609 is an air pump. The air pump 609 pumps air into the balloon 611 to expand the balloon 611 within the ambient 604 thereby decreasing ambient volume, or, the air pump 609 draws air out of the balloon 611 to collapse the balloon 611 within the ambient 604 thereby increasing ambient volume.

In another approach the expandable/compressible structure 611 is a sheathed/covered foldable structure (like an umbrella tent) and the motor is a servo motor 609. The servo motor 609 pushes or rotates in a first direction that causes the covered foldable structure 611 to at least partially unfold within the ambient 604 thereby decreasing ambient volume, or, the servo motor 609 pushes or rotates in a second/opposite direction that causes the covered foldable structure 611 to at least partially fold within the ambient 604 thereby increasing ambient volume.

FIG. 6*a* shows a first extreme transition in which the motor 609 has just fully collapsed the structure 611. This corresponds to maximum ambient volume 604 (which in turn corresponds to minimum boiling point and maximum vaporization). By contrast, FIG. 6*b* shows a second extreme transition in which the motor 609 has just fully expanded the structure 611 within the ambient 604. This corresponds to minimum ambient volume 604 (which in turn corresponds to maximum boiling point and minimum vaporization).

In operation, if monitored conditions indicate the temperature of the output fluid 606 is encroaching a low limit, the controller 610 activates the motor 609 to collapse the structure 611, which in turn increases vaporization and causes the temperature of the output fluid 606 to rise. By contrast, if monitored conditions indicate the temperature of the output fluid 606 is encroaching a high limit, the controller 610 activates the motor 609 to expand the structure 611, which in turn decreases vaporization and causes the temperature of the output fluid 606 to fall.

Various other embodiments may combine two or more of the specific modulation techniques described above into a single system.

The above described thermal cooling dynamics of the system were largely directed to the system's operation during its transition from one steady state to another steady state. With respect to reaching the steady state, however, the temperature of the vapor in the ambient is apt to follow the temperature of the immersion bath. The temperature of the immersion bath, in turn, is apt to follow its boiling point.

Thus, for instance, in the case where the workload of the electronics is suddenly increased and the boiling point of the liquid bath is increased to diminish an increase in the boiling rate, the temperature of the vapor will nevertheless rise because the vapor that is generated into the ambient will have higher temperature as it emanates from a liquid having a raised boiling point. The increase in the vapor temperature could cause the warmed liquid from the condenser to surpass some maximum.

As such, in embodiments that extend from those described just above, the thermal resistance of the condenser is changed to help the system realize a steady state that creates an output fluid from the condenser that stays within a predetermined range.

Here, for example, the thermal resistance of the condenser can be increased by increasing the flow rate of the liquid through the condenser and/or decreasing the temperature of the condenser's input liquid. Either of these approaches will reduce the temperature response of the output liquid from the condenser such that an appreciable rise in the temperature of the vapor does not result in a corresponding appreciable rise in the temperature of the condenser's output liquid.

Thus, continuing with the above example where the temperature of the vapor rises in response to the boiling point of the immersion bath being raised to counteract an increase in heat dissipation from the electronics within the bath, in extended embodiments, the flow rate of the liquid through the condenser is increased and/or the temperature of the liquid that is injected into the condenser is lowered so that the temperature of the liquid being provided by the condenser does not appreciably rise (if at all) and stays below some maximum bound that is set for the temperature of the condenser's output liquid.

Similarly, in the case where the workload of the electronics is suddenly decreased and the boiling point of the liquid bath is decreased to promote an increase in the boiling rate, the temperature of the vapor will nevertheless fall because the vapor that is generated into the ambient will have lower temperature as it emanates from a liquid having a lowered boiling point. The decrease in the vapor temperature could cause the warmed liquid from the condenser to fall below some minimum.

In this case, the thermal resistance of the condenser can be decreased. More specifically, the flow rate of the liquid through the condenser is decreased and/or the temperature of the liquid that is injected into the condenser is increased so that the temperature of the liquid being provided by the does not appreciably fall (if at all) and stays above some minimum bound that is set for the temperature of the condenser's output liquid.

Changing the thermal resistance of the condenser can be performed in conjunction with boiling point changes induced by ambient volume changes as described at length above (e.g., with respect to FIGS. 2, and 3*a,b* through 6*a,b*) to realize a system that produces a relatively stable condenser output fluid temperature in both transient and steady states.

Is still other embodiments, ambient volume changes are not even performed, but rather, a relatively stable condenser output fluid temperature in achieved for both transient and steady states just by changing the thermal resistance of the condenser.

Adjustments to the condenser's thermal resistance can also be controlled by the aforementioned controller 210, 310, 410, 510, 610 or similar controller. Specifically, for instance, the controller can be coupled to a pump that drives the liquid through the condenser to adjust the flow rate through the condenser as described above. Similarly, the liquid that is driven through the condenser can be heated by a heater before the liquid enters the condenser. The controller can also be coupled to such a heater to adjust the input temperature of the fluid as described above.

The controller discussed at length above can be implemented on one or more of the electronic circuit boards that are immersed in the immersion bath, or, the controller can reside outside the chamber. The controller can be implemented with hardware, software or a combination of hardware and software. The hardware can include dedicated hardwired circuitry (e.g., application specific integrated circuit (ASIC) circuitry), programmable circuitry (e.g., field programmable gate array (FPGA) circuitry), and/or circuitry designed to execute program code written to perform one or more functions of the aforementioned ambient volume modulation and/or condenser thermal resistance change processes (e.g., processor circuitry, microcontroller circuitry, etc.).

Figure 7:
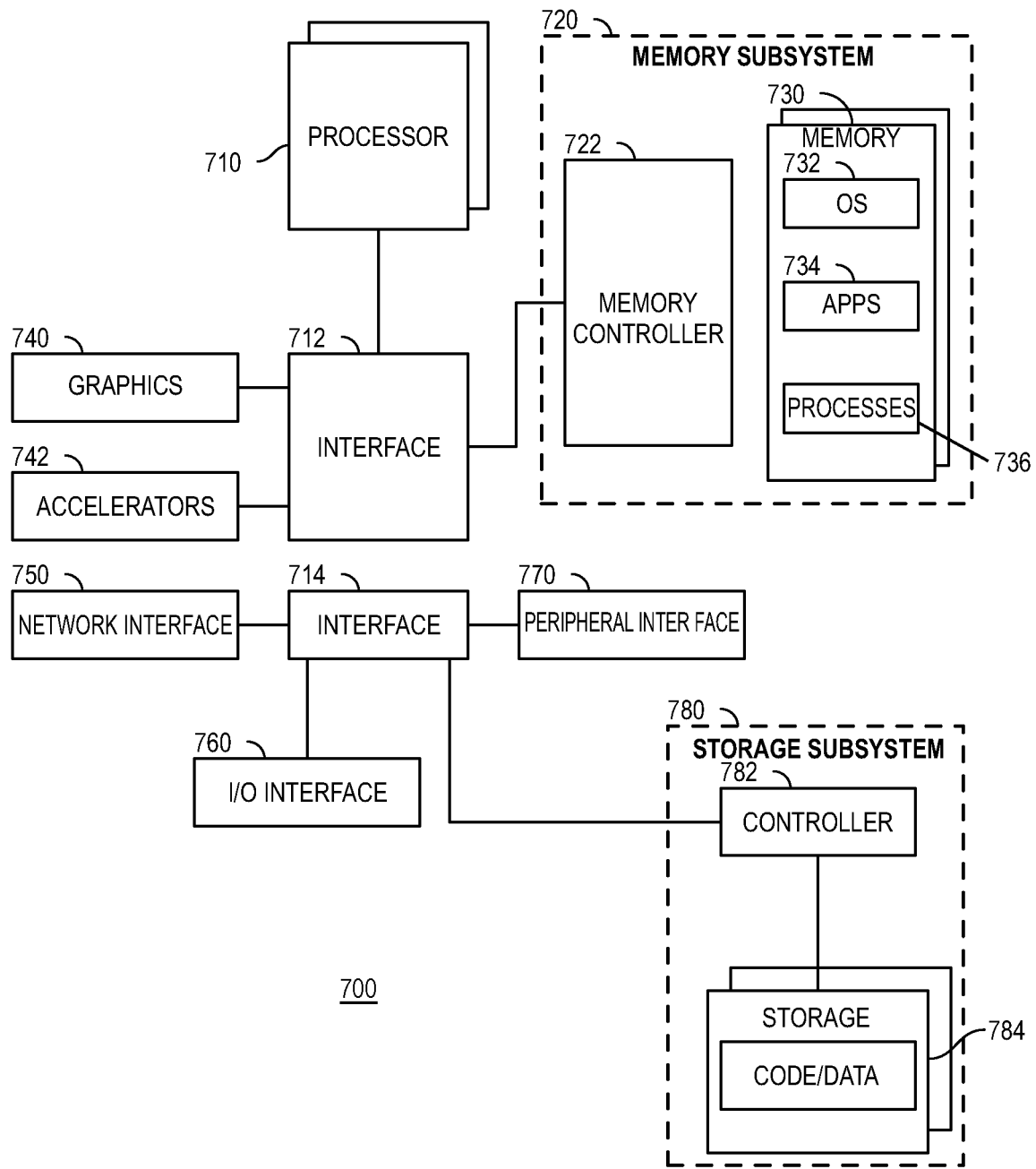
FIG. 7 shows a system.
Figure 8:
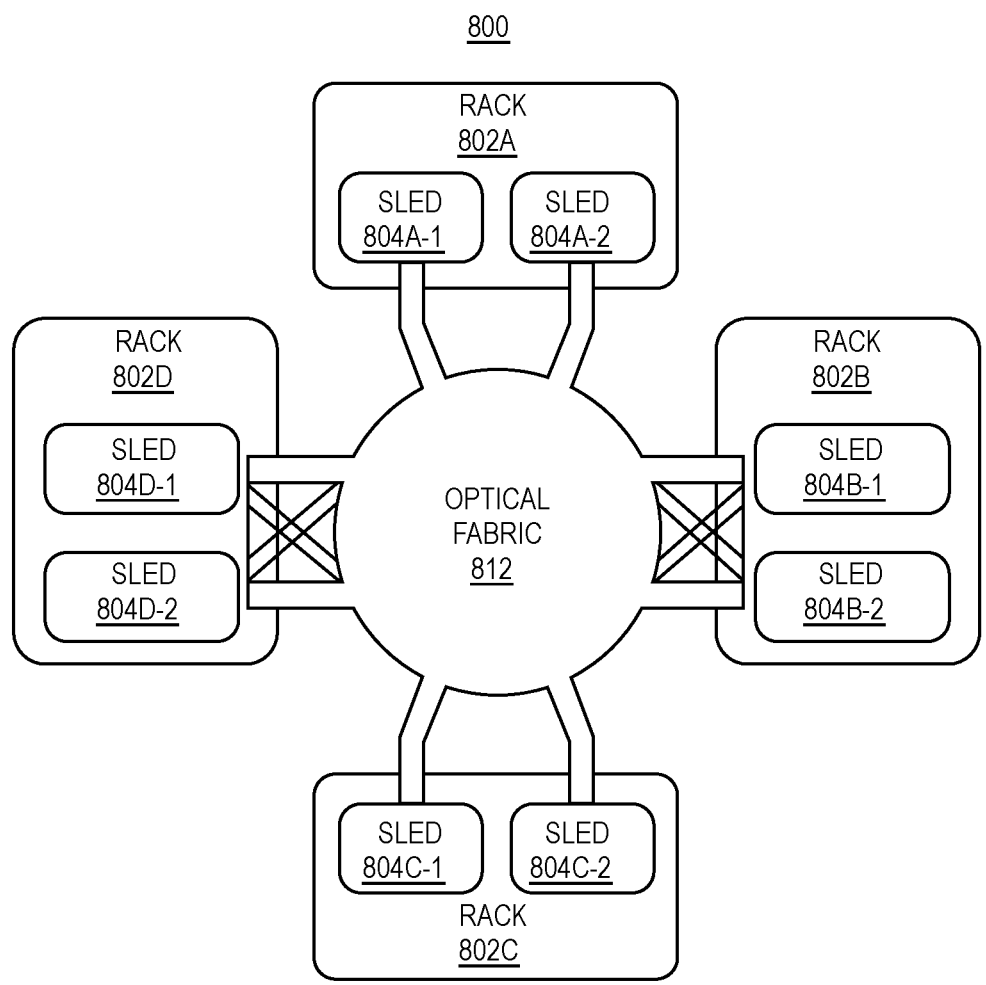
FIG. 8 shows a data center.
Figure 9:
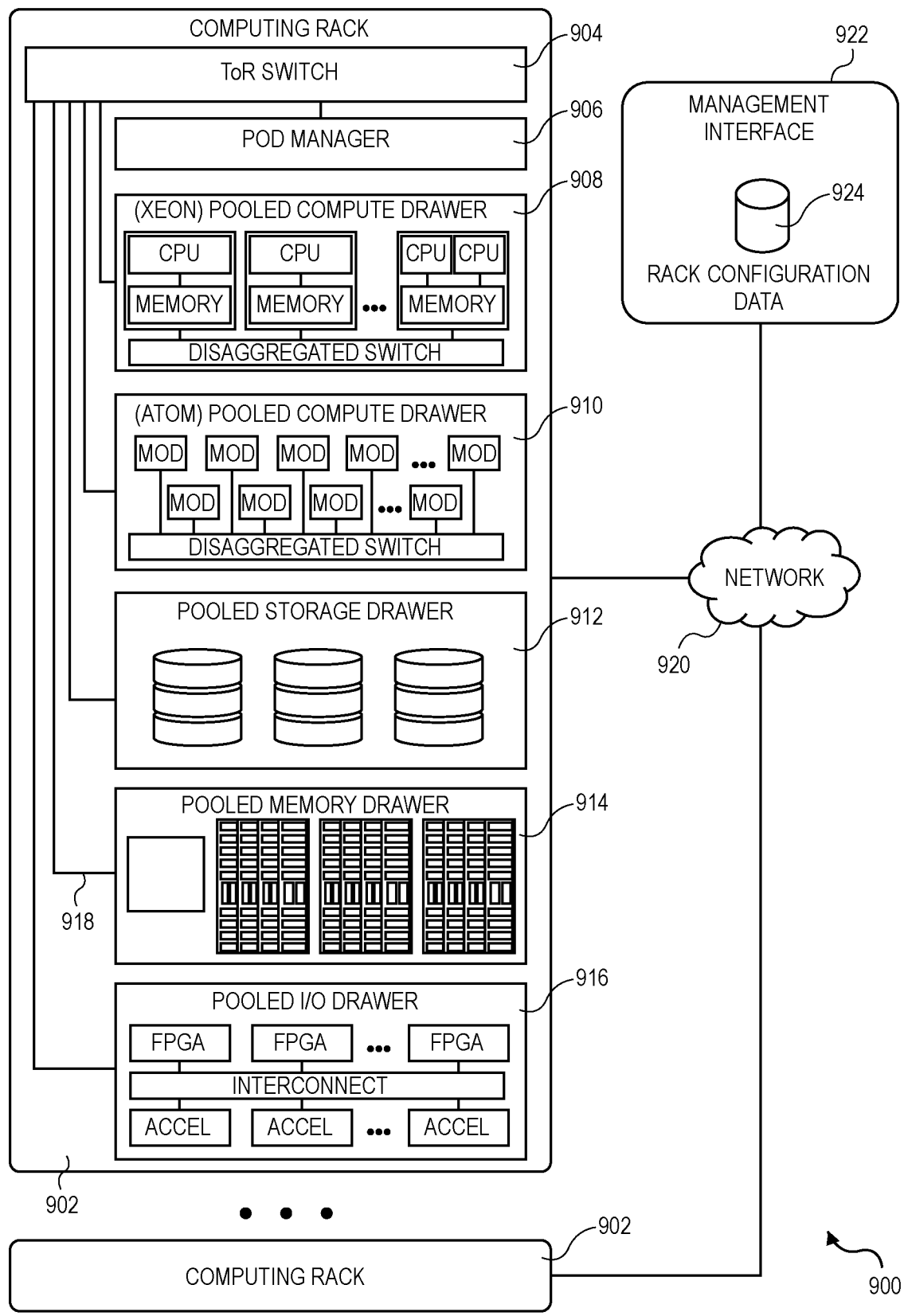
FIG. 9 shows a rack.

The following discussion concerning FIGS. 7, 8 and 9 are directed to systems, data centers and rack implementations, generally. As such, FIG. 7 generally describes possible features of an electronic system that can include one or more electronic boards whose electronic devices (semiconductor chips) are cooled according to the teachings above. FIG. 8 describes possible features of a data center that include such electronic systems. FIG. 9 describes possible features of a rack. Here, one or more racks, or one or more rack shelfs, can be immersed in a liquid bath as cooled as described in the teachings above.

FIG. 7 depicts an example system. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software functionality to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include stand-alone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 7, other types of systems to which the above described invention can be applied and are also partially or wholly described by FIG. 7 are communication systems such as routers, switches and base stations.

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks.

Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 that includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or an 100+Gb/s Silicon Photonics (SiPh) optical link. In one embodiment high-speed link 918 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 900 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations. RSD environment 900 further includes a management interface 922 that is used to manage various aspects of the RSD environment. This includes managing rack configuration, with corresponding parameters stored as rack configuration data 924.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
   memory;
   machine-readable instructions; and
   at least one processor circuit to be programmed by the machine-readable instructions to:
   cause a volume of an ambient of a two phase immersion cooling system to increase in response to a first temperature of a fluid approaching a first lower limit, the ambient including a condenser that is to emit the fluid warmed by vapor in the ambient, the vapor to be generated by heat, the heat to be generated by electronic devices immersed in a liquid bath; and
   cause the volume to decrease in response to a second temperature of the fluid approaching a second higher limit.

2. The apparatus of claim 1, wherein one or more of the at least one processor circuit is to cause the volume to increase by causing a volume of the liquid bath to decrease.

3. The apparatus of claim 2, wherein one or more of the at least one processor circuit is to cause the volume to decrease by causing the volume of the liquid bath to increase.

4. The apparatus of claim 1, wherein one or more of the at least one processor circuit is to cause the volume to increase by causing a piston within the ambient to move in a direction away from the ambient.

5. The apparatus of claim 4, wherein one or more of the at least one processor circuit is to cause the volume to decrease by causing the piston within the ambient to move in a direction toward the ambient.

6. The apparatus of claim 1, wherein one or more of the at least one processor circuit is to cause the volume to increase by causing a ceiling of a chamber that contains the ambient and the liquid bath to raise.

7. The apparatus of claim 6 wherein one or more of the at least one processor circuit is to cause the volume to decrease by causing the ceiling to lower.

8. The apparatus of claim 1 wherein one or more of the at least one processor circuit is to cause the volume to increase by causing a structure within the ambient to contract.

9. The apparatus of claim 1 wherein one or more of the at least one processor circuit is to cause a thermal resistance of the condenser to change to keep a temperature of the fluid that is warmed by the vapor within a predetermined range.

10. A two phase immersion cooling system comprising:
    a chamber containing an immersion bath and an ambient, the chamber having a ceiling;
    a condenser in the ambient, the condenser to emit fluid that is warmed by vapor in the ambient, the vapor to be generated by heat, the heat to be generated by electronic devices in the immersion bath;
    at least one sensor to detect a temperature of the fluid or a parameter of the two phase immersion cooling system that affects the temperature of the fluid;
    a motor coupled to the ceiling; and
    at least one processor circuit to, in response to outputs of the at least one sensor, cause the motor to raise or lower the ceiling of the chamber to control the temperature of the fluid.

11. The two phase immersion cooling system of claim 10, wherein the at least one sensor is to detect one or more of a temperature of the fluid; an amount of the vapor; electrical current; or workload of the electronic devices.

12. The two phase immersion cooling system of claim 10, including a pump and a reservoir coupled to the chamber, one or more of the at least one processor circuit to modulate a volume of the immersion bath to control the temperature of the fluid.

13. The two phase immersion cooling system of claim 10, wherein the motor is a first motor and the first motor or a second motor is to cause a piston to move toward or away from the ambient.

14. The two phase immersion cooling system of claim 10, wherein the motor is a first motor and the first motor or a second motor is to cause a structure within the ambient to expand or contract.

15. The two phase immersion cooling system of claim 10, wherein one or more of the at least one processor circuit is to cause a thermal resistance of the condenser to change to keep the temperature of the fluid that is warmed by the vapor within a predetermined range.

16. A data center comprising:
a plurality of computer systems communicatively coupled by one or more networks, the plurality of computer systems to execute software applications that correspond to functions performed by the data center, the plurality of computer systems implemented with multiple circuit boards, the multiple circuit boards within an immersion bath within a chamber, an ambient within the chamber, a condenser within the ambient that emits fluid warmed by vapor within the ambient, the vapor warmed by heat, the heat generated by electronic devices of the multiple circuit boards;
a sensor to sense a temperature of the warmed fluid or another parameter that affects the temperature of the warmed fluid;
a motor; and
at least one processor circuit to, in response to an output of the sensor, cause the motor to cause a structure within the ambient to expand or contract to control the temperature of the warmed fluid by modulating a volume of the ambient.

17. The data center of claim 16 wherein the data center is a micro data center.

18. The data center of claim 16 wherein the data center is to provide content delivery and/or edge computing services.

19. The data center of claim 16, wherein the motor is an air pump and the structure is a balloon.

* * * * *